(12) United States Patent
Lanio et al.

(10) Patent No.: US 9,697,983 B1
(45) Date of Patent: Jul. 4, 2017

(54) THERMAL FIELD EMITTER TIP, ELECTRON BEAM DEVICE INCLUDING A THERMAL FIELD EMITTER TIP AND METHOD FOR OPERATING AN ELECTRON BEAM DEVICE

(71) Applicant: ICT Integrated Circuit Testing Gesellschaft für Halbleiterprüftechnik mbH, Heimstetten (DE)

(72) Inventors: Stefan Lanio, Erding (DE); Aleksandra Kramer, München (DE); John Breuer, München (DE)

(73) Assignee: ICT Integrated Circuit Testing Gesellschaft für Halbleiterprüftechnik mbH, Heimstetten (DE)

( * ) Notice: Subject to any disclaimer, the term of this patent is extended or adjusted under 35 U.S.C. 154(b) by 0 days.

(21) Appl. No.: 15/056,244

(22) Filed: Feb. 29, 2016

(51) Int. Cl.
*H01J 37/073* (2006.01)
*H01J 1/16* (2006.01)
*H01J 19/10* (2006.01)
*H01J 9/02* (2006.01)

(52) U.S. Cl.
CPC .............. *H01J 37/073* (2013.01); *H01J 1/16* (2013.01); *H01J 9/02* (2013.01); *H01J 19/10* (2013.01); *H01J 2237/06341* (2013.01)

(58) Field of Classification Search
None
See application file for complete search history.

(56) References Cited

U.S. PATENT DOCUMENTS

| | | | | |
|---|---|---|---|---|
| 3,817,592 A * | 6/1974 | Swanson | ............... | H01J 9/025 148/568 |
| 4,486,684 A * | 12/1984 | Hohn | ............... | H01J 1/16 313/336 |
| 5,616,926 A * | 4/1997 | Shinada | ............... | H01J 1/304 250/423 F |
| 6,798,126 B2 * | 9/2004 | Schwind | ............... | H01J 1/14 313/309 |

\* cited by examiner

*Primary Examiner* — Jack Berman
(74) *Attorney, Agent, or Firm* — Kilpatrick Townsend & Stockton LLP

(57) ABSTRACT

An electron beam device for inspecting a sample with an electron beam is described. The electron beam device includes an electron beam source including a thermal field emitter, which includes an emitter tip having an emission facet configured for electron emission, wherein the emission facet has an emission facet width; and a first side facet and a second side facet, wherein an edge facet is formed between the first side facet and the second side facet, which has an edge facet width. The edge facet width is between 20% and 40% of the emission facet width. The electron beam source further includes an extractor device; and a heating device for heating the thermal field emitter. The electron beam device further includes electron beam optics and a detector device for detecting secondary charged particles generated at an impingement or hitting of the primary electron beam on the sample.

20 Claims, 4 Drawing Sheets

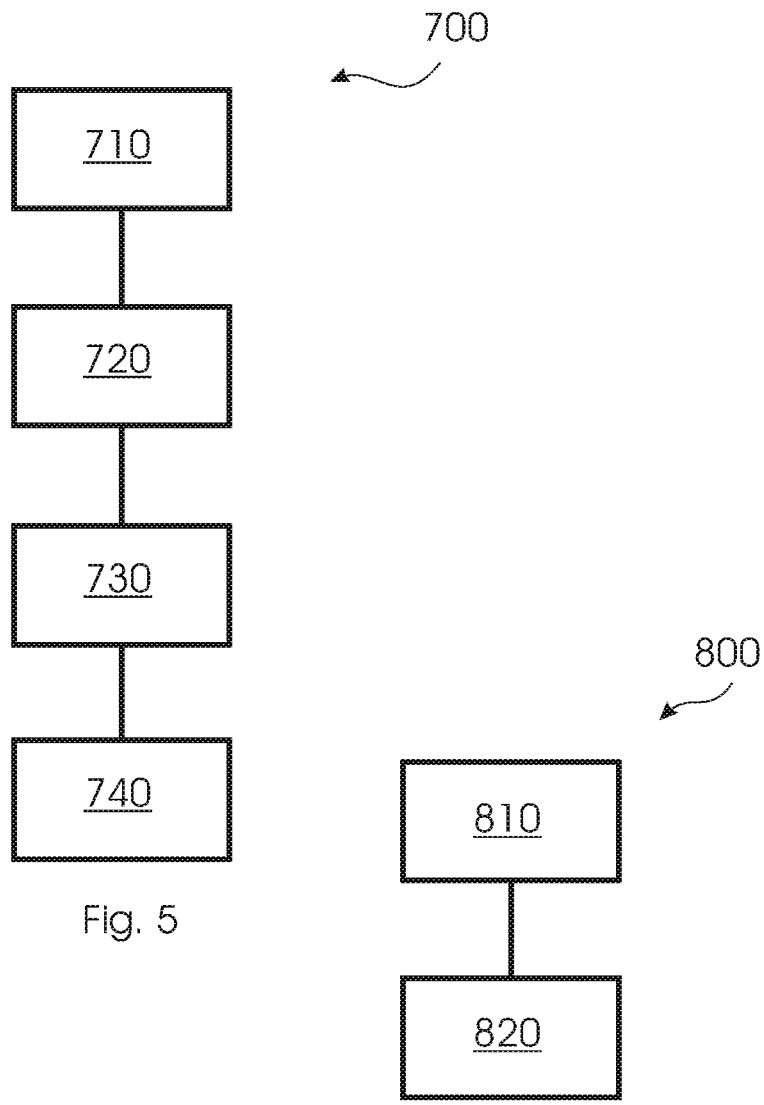

ial field electron emitter and electron beam devices, for example, for inspection system applications, testing system applications, lithography system applications, defect review or critical dimensioning applications or the like.

THERMAL FIELD EMITTER TIP, ELECTRON BEAM DEVICE INCLUDING A THERMAL FIELD EMITTER TIP AND METHOD FOR OPERATING AN ELECTRON BEAM DEVICE

TECHNICAL FIELD

Embodiments of the present disclosure relate to an electron emitter source for an electron beam device, an electron beam device, a method for producing an electron emitter for an electron beam device and a method for operating an electron emitter for an electron beam device. Embodiments of the present disclosure specifically relate to a thermal field electron emitter and electron beam devices, for example, for inspection system applications, testing system applications, lithography system applications, defect review or critical dimensioning applications or the like.

BACKGROUND

Charged particle beam devices can be used, for example, in electron beam inspection (EBI), defect review and critical dimension measurement. Upon irradiation of a specimen or sample by a primary charged particle beam, signal charged particles, such as secondary electrons (SE) or backscattered charged particles, are created, which may carry information about the topography of the sample, the chemical constituents of the sample, the electrostatic potential of the sample and other information about the sample. The signal charged particles are collected and guided to a sensor, e.g., a scintillator, a pin diode or the like.

The performance of a charged particle source, such as an electron emitter, providing the primary charged particle beam in a charged particle beam device is of particular interest. As an example, high brightness charged particle sources and/or high emission current sources with high emission stability are beneficial. The charged particle sources are operated under vacuum conditions, wherein the performance of the charged particle sources can be related to a quality of the vacuum.

Thermal Field Emitter (TFE) are established as electron sources for electron microscopes, especially due to the relatively high brightness, relatively small energy width, moderate vacuum standards and good short term emission stability and low beam current noise. However, commercially available TFE often exhibit unwanted stability problems, such as a long term, continuous decrease in angular intensity, which is attributed to a general growth of the tip, which leads to a reduction of field strength at the tip apex, hence reduced emission current and spontaneous changes in angular intensity (brightness). The general growth of the tip, the reduction of the field strength, and the reduced emission current are known as so-called ring collapsing, which is usually attributed to the re-arranging of atoms in the atom layers at the tip of the emitter, where the electrons are released.

In view of the above, it is an aim to provide an emitter for a charged particle beam, a charged particle beam device, and a method for producing and operating an emitter for a charged particle beam device that overcome at least some of the problems in the art.

SUMMARY

In light of the above, an electron beam device, a thermal field emitter, a method for operating an electron beam device and a method for producing a thermal field emitter according to the independent claims are provided. Further aspects, advantages, and features are apparent from the dependent claims, the description, and the accompanying drawings.

According to one embodiment, electron beam device for inspecting a sample with an electron beam is provided. The electron beam device includes an electron beam source including a thermal field emitter for emitting an electron beam. The thermal field emitter includes an emitter tip including an emission facet configured for electron emission, wherein the emission facet has an emission facet width, and a first side facet and a second side facet, wherein an edge facet is formed between the first side facet and the second side facet, the edge facet having an edge facet width. The edge facet width is between 20% and 40% of the emission facet width. The electron beam source further includes an extractor device for applying an extraction voltage between the thermal field emitter and the extractor device, and a heating device for heating the thermal field emitter. The electron beam device further includes electron beam optics for directing and focusing the electron beam onto the sample and a detector device for detecting secondary charged particles generated at an impingement or hitting of the electron beam on the sample.

According to another embodiment, a thermal field emitter for emitting an electron beam in an electron beam device is provided. The thermal field emitter includes an emitter tip including an emission facet configured for electron emission, wherein the emission facet has an emission facet width, and a first side facet and a second side facet, wherein an edge facet is formed between the first side facet and the second side facet, the edge facet having an edge facet width. The edge facet width is between 20% and 40% of the emission facet width.

According to a further embodiment, a method for producing an emitter tip for a thermal field emitter for a source of an electron beam is provided. The method includes providing an emitter tip having an emitter tip surface, and processing the emitter tip by heating the emitter tip and applying an electrical field to the emitter tip, wherein an emission facet configured for electron emission having an emission facet width, a first side facet, a second side facet, and an edge facet between the first side facet and the second side facet having an edge facet width are formed, in particular by the processing. An edge facet width is formed to be between 20% and 40% of an emission facet width.

According to a further embodiment, method for operating an electron beam device is provided. The method includes providing an electron beam source including a thermal field emitter and an extractor device, wherein the thermal field emitter includes an emitter tip. The emitter tip includes an emission facet configured for electron emission, wherein the emission facet has an emission facet width, and a first side facet and a second side facet, wherein an edge facet is formed between the first side facet and the second side facet, the edge facet having an edge facet width. The edge facet width is between 20% and 40% of the emission facet width. The method further includes heating the thermal field emitter with a heating device, applying an extraction voltage between the thermal field emitter and the extractor device of the electron beam source, and emitting electrons from the emission facet.

Embodiments are also directed at apparatuses for carrying out the disclosed methods and include apparatus parts for performing each described method features. The method features may be performed by way of hardware components, a computer programmed by appropriate software, by any combination of the two or in any other manner. Furthermore, embodiments are also directed at methods with which the described apparatus operates. Embodiments include method features for carrying out every function of the apparatus.

BRIEF DESCRIPTION OF THE DRAWINGS

So that the manner in which the above recited features can be understood in detail, a more particular description, briefly summarized above, may be had by reference to embodiments. The accompanying drawings relate to embodiments and are described in the following:

FIG. 5 shows a flow chart of a method for operating an electron beam device according to embodiments described herein; and FIG. 6 shows a flow chart of a method for producing an emitter tip for a thermal field emitter according to embodiments described herein

DETAILED DESCRIPTION OF EMBODIMENTS

Reference will now be made in detail to the various embodiments, one or more examples of which are illustrated in the figures. Within the following description of the drawings, the same reference numbers refer to same components. The differences with respect to individual embodiments are described. Each example is provided by way of explanation and is not meant as a limitation. Further, features illustrated or described as part of one embodiment can be used on or in conjunction with other embodiments to yield yet a further embodiment. It is intended that the description includes such modifications and variations.

Figure 1:
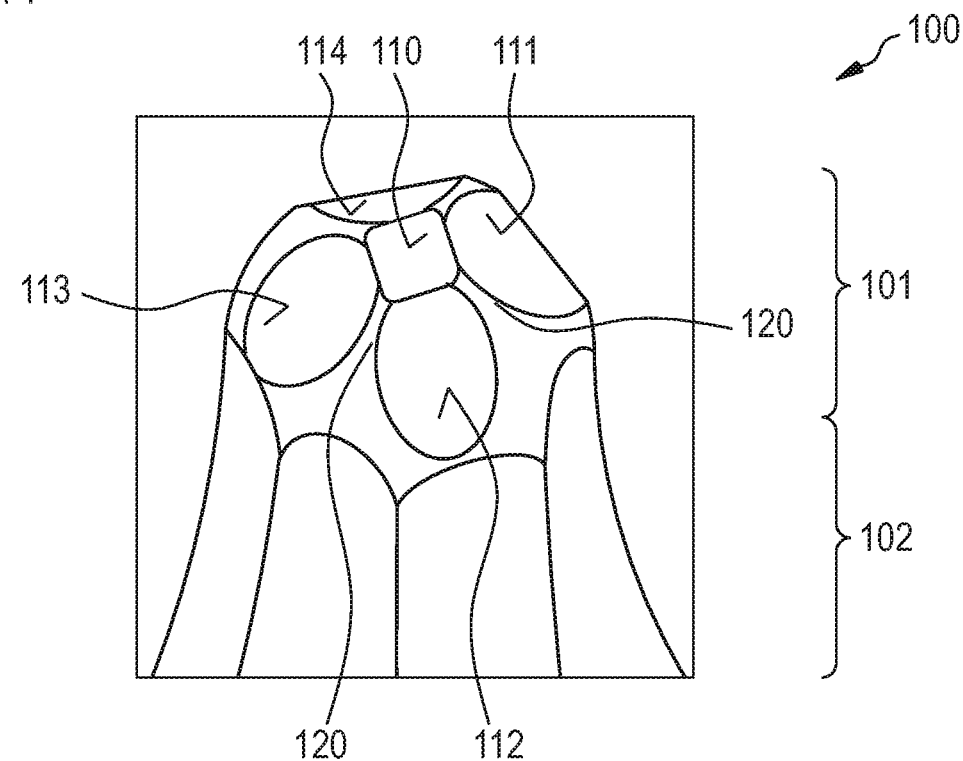
FIG. 1 shows a schematic perspective view of a thermal field emitter tip according to embodiments described herein.

FIG. 1 shows an emitter tip 100 for a thermal field emitter according to embodiments described herein. The emitter tip 100 has a first portion 101 and a second portion 102. According to some embodiments, the first portion 101 has a polyhedron-like shape, such as a substantially cube-like shape, a polyhedron-like shape with a substantially hexagonal cross-section, a polyhedron-like shape with a substantially octagonal cross-section, a rounded cube shape, a sphere interrupted by the facets 110 to 114, or the like. The second portion 102 may be an emitter shank and/or may provide a lengthy shape, such as, for instance, the shape of a polygonal cylinder as shown in FIG. 1, an angular cylinder, an angular conus, a bar, a round cylinder or any suitable shape for forming the shank of an emitter tip for an electron beam device as described in embodiments herein.

According to some embodiments described herein, the first portion 101 and the second portion 102 are made from the same one or more materials and may include portions of one crystalline material, in particular a monocrystalline material, as will be explained in detail below.

As can be seen in the embodiment shown in FIG. 1, the emitter tip 100, in particular the first portion 101 of the emitter tip 100, includes one emission facet 110 and a first side facet 111, a second side facet 112, a third side facet 113, and a fourth side facet 114. In some embodiments, the side facets 111 to 114 of the emitter tip 100 are arranged adjacent to the emission facet 110. According to some embodiments, the side facets are arranged around the emission facet, and, in particular, surround the emission facet 110.

According to embodiments described herein, the term "facet" as used herein may be described as a recess in the emitter tip. In some embodiments, the facet may have a certain thickness extending into the emitter tip. The thickness of the facet may be defined as the deepness of the recess, especially compared to a completely round or sphere-like shape of the first portion of the emitter tip. In some embodiments, the thickness of the facet may vary over the area or size of the facet. According to some embodiments, the facets as referred to herein (such as emission facet or side facets) may have a substantially round shape, a substantially rectangular shape, a substantially squarish shape, a substantially octagonal shape, a substantially polygonal shape, a rectangular or polygonal shape with rounded corners, an elongated shape and the like.

The emission facet has an emission facet width. Each of the side facets has a side facet width.

Figure 2:
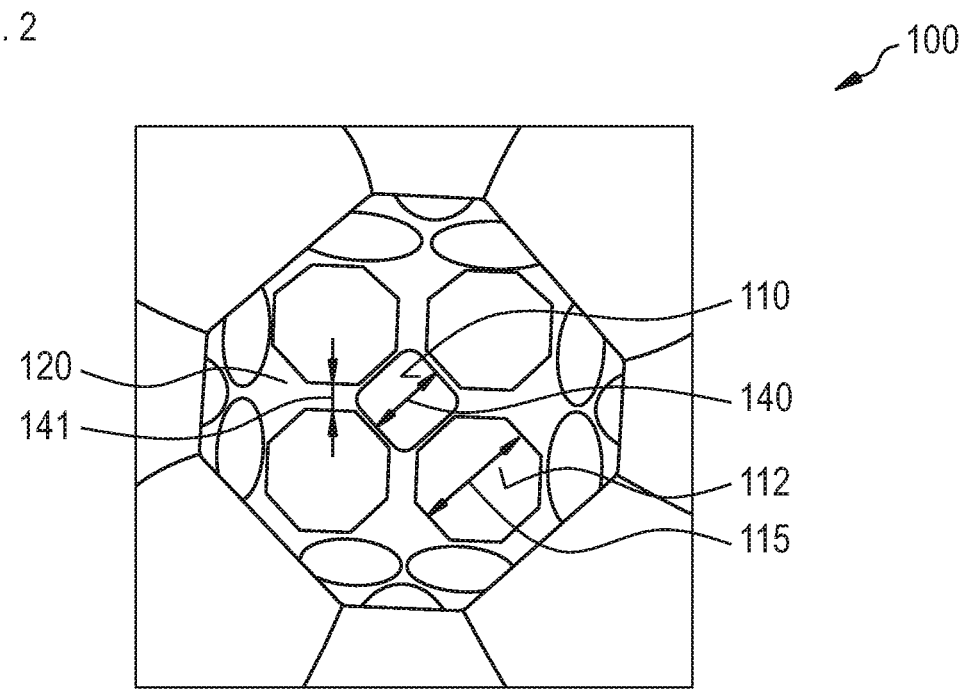
FIG. 2 shows a schematic bottom view of a thermal field emitter tip according to embodiments described herein.

The emission facet width is exemplarily shown in the embodiment shown in FIG. 2 as emission facet width 140. Each of the side facets has a side facet width 115. The side facet width is drawn for one side facet in FIG. 2 for the sake of the better overview. According to some embodiments, the emission facet width and/or the side facet width may be understood as one dimension (such as one diameter) of the emission facet or the side facet in one direction, and in particular the minimum dimension (such as the minimum diameter) of the emission facet or the side facet. According to some embodiments, the emission facet width or side facet width may be measured in the plane of the respective facet, or in the plane spanned by the boundaries of the respective facet.

The facets according to embodiments described herein each may have a facet boundary delimiting the facet size. A facet boundary may be described as the line, where one facet ends. As can exemplarily be seen in FIGS. 1 and 2, the side facets are separated from each other by edge facets 120 and in particular, the side facet ends, where the edge facet begins.

FIGS. 1 and 2 show edge facets 120 being formed between the side facets, in particular between the first side facet 111 and the second side facet 112, the second side facet 112 and the third side facet 113, the third side facet 113 and the fourth side facet 114, and the fourth side facet 114 and the first side facet 111. According to embodiments described herein, an edge facet between two side facets has an edge facet width 141, as can exemplarily be seen in FIG. 2.

As used herein, an edge facet may be understood as a strip or band between the side facets. In some embodiments, the edge facet is a substantially straight strip or band between two side facets. In particular, the edge facet between two side facets is limited by the boundaries of the side facets. According to some embodiments, the edge facet is limited at two sides of the edge facet by two side facets and at one side by the emission facet.

According to some embodiments, an edge facet width as described herein may be an extension of the edge facet in one direction, such as the extension of the edge facet in the direction of the minimum extension of the edge facet, in particular in the plane spanned by the side facet boundaries of the side facets adjacent to the edge facet. In some embodiments, the edge facet width may be measured as the shortest distance between two adjacent side facets. For instance, an edge facet may provide a substantially elongated shape, such as a shape of a rectangle, an elongated polyhedron, an elongated round shape, an oval shape or the like. For an edge facet having an elongated shape, the edge facet width may be a dimension of the edge facet substantially perpendicular to the longitudinal direction of the edge facet. As can be seen in FIGS. 1 and 2, the edge facets 120 face the emission facet 110 in a direction of the edge facet being substantially perpendicular to the longitudinal direction of the edge facet. According to some embodiments, the side facets and the edge facets together surround the emission facet.

The term "substantially" as used herein may mean that there may be a certain deviation from the characteristic denoted with "substantially." For instance, the term "substantially squarish" refers to a shape which may have certain deviations from the exact squarish shape, such as a deviation of about 1% to 10% of the general extension in one direction. In one example, the term "substantially perpendicular" may be understood as an arrangement, which may deviate from the strict "perpendicular" angle by about 1° to about 15°.

In some embodiments, the emission facet may be the facet of the emitter tip having the largest emission of electrons during operation. For instance, the emission facet may be the facet having a low, or even the lowest, work function among the facets of the emitter tip. According to some embodiments, the emission facet may be the area of the emitter tip having the largest electron emission during operation. The emission facet may be described as being a facet and the area of the emitter tip providing the main electron beam of the emitter tip. According to some embodiments, the main electron beam may be the beam travelling along the optical axis of the electron beam device, in which the emitter tip is to be used.

In some embodiments described herein, the edge facet width may be smaller than the emission facet width or the side facet width. According to embodiments described herein, the edge facet width may be between 15% and 45% of the emission facet width, in particular between 20% and 40%, and even more typically between 25% and 35%. In some embodiments, the edge facet width may be about 30%, of the emission facet width.

According to some embodiments, the emission facet width may typically be between about 100 nm and about 1000 nm, more typically between about 200 nm and about 500 nm, and even more typically between about 250 nm and 350 nm.

Figure 3:
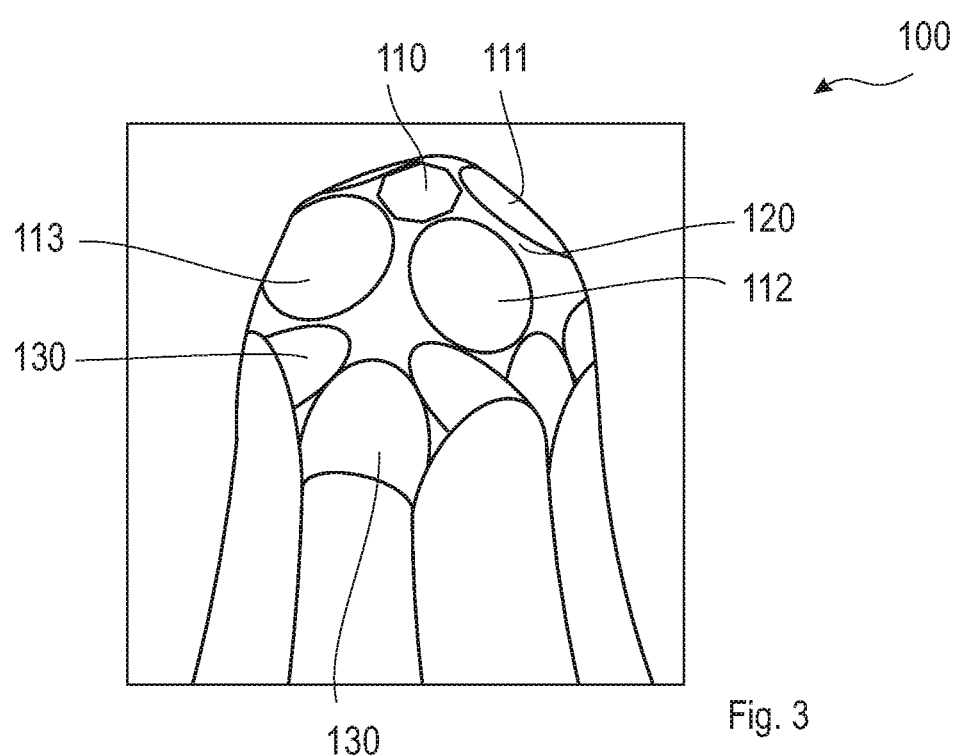
FIG. 3 shows a schematic perspective view of a thermal field emitter tip according to embodiments described herein.

FIG. 3 shows an emitter tip 100 for a thermal field emitter according to embodiments described herein. FIG. 3 shows an embodiment of the emitter tip 100, in which the side facets 111 to 114 are inclined with respect to the emission facet 110. For instance, the side facets are arranged in a plane different from the plane of the emission facet. According to some embodiments, the plane of a facet is a plane including the boundary of the respective facet. In some embodiments, the side facets may stand in an angle to the emission facet, wherein the angle may typically be between about 25° to about 50°, more typically between about 30° to about 45°, and even more typically between about 35° and about 45°. In some embodiments, the emitter tip includes tungsten and side facets extending in the 110 crystallographic plane, which in particular corresponds to an angle of 45° to the emission facet. In some embodiments, the emitter tip includes tungsten and edge facets extending in the 211 crystallographic plane, which in particular corresponds to an angle of 35° to the emission facet.

According to some embodiments, which may be combined with other embodiments described herein, the emitter tip may be a crystalline emission tip, in particular a single crystal emitter tip or a monocrystalline emitter tip. In some embodiments, the emission facet may have a 100 crystallographic orientation (corresponding to the orientation of the emission facet in the crystallographic planes of the emitter tip according to the Miller indices). According to some embodiments, the emission facet may be formed so as to be oriented substantially perpendicular to the optical axis of the electron beam device, in or for which the emitter tip is to be used. According to some embodiments, the side facets have a crystallographic orientation different from the crystallographic orientation of the emission facet and/or the edge facet has a crystallographic orientation different from the crystallographic orientation of the side facets and the emission facet. In some embodiments, which may be combined with other embodiments described herein, at least the first and the second side facets may have a 110 crystallographic orientation. According to some embodiments, which may be combined with other embodiments described herein, the edge facet(s) may have a 211 crystallographic orientation.

FIG. 3 shows further side facets 130 of the emitter tip 100, being arranged beside the side facets, e.g. in the direction of the shaft or the second portion 102 of the emitter tip. The further side facets 130 may have substantially the same size and shape as the side facets. In some embodiments, the further side facets 130 have a more elongated shape than the side facets 111 to 114. According to some embodiments, the side facets of the emitter tip are arranged adjacent to the emission facet. The further side facets 130 may be arranged adjacent to the side facets.

Known emitter systems often do not provide the stability for high resolution applications of an electron beam device. For instance, ring collapsing happens when the emitter is operated at low emission current, which is the operating mode also leading to low energy width. However, the low emission current is useful for high resolution applications. Experiments and longtime experience show that the emitter systems as known show the following behavior and may use the following corrective actions: Unstable performance of the emitter tip after the installation (a stabilization period is used for getting a stable performance). The stabilization period means that the electron beam device is not used and the system is down, which increases the costs and is often not accepted by the customers. Long term, the emitter systems as known show a decrease in emission current. Since a constant beam current (probe current at the wafer) is beneficial for the electron beam devices, a compensating action is used by increasing the extraction voltage. The increasing extraction voltage is accompanied by an increasing total emission current of the emitter tip (although the current which is emitted into the small solid angle of the actual probe forming beam is kept constant). The increased extraction voltage leads to a higher risk of arcing in the electron emitter chamber. The increasing electrical power emitted by the emitter tip may also lead to a higher temperature of the emitter system, which leads to vacuum deterioration which, in the end, negatively impacts the emission properties of the emitter system. A cycle of dropping emission, increasing extraction voltage and deteriorating vacuum starts, which either limits the beam current that can be drawn from the cathode to an unacceptable low level or leads to a situation where the power supplies can no longer provide the respective voltage or current. In both cases, the emitter tip may be replaced and the tool will be down for a few days, which (again) increases the costs of ownership.

The thermal field emitter and the electron beam device according to embodiments described herein solve at least some of the above described problems. In particular, the thermal field emitter and the electron beam device according to embodiments described herein allow for providing a stable operation at high brightness, even close to the maximum field strength that can be applied to the thermal field emitter tip before the emitter tip (e.g. a crystalline emitter tip) starts to grow arbitrary protrusions and the emission becomes unstable and unpredictable. The emitter tip having an emission facet with a 100 orientation (or an orientation substantially perpendicular to the optical axis of the electron beam device) according to embodiments described herein helps to realize the possibility of a stable operation at high brightness.

The thermal field emitter according to embodiments described herein allows for being started and stabilized almost instantaneously (like a light bulb). The thermal field emitter according to embodiments described herein can be operated for a much longer time at constant beam current without noticeable increase in extraction voltage and overall extraction current.

The emitter tip according to embodiments described herein shows several beneficial effects compared to known emitter tips. For instance, completely round emitter tips do not provide a stable emission long term. On the other hand, polygonal emitter tips with sharp edges cause instability, too, since the sharp edges (due to the field enhancement) emit a lot of current which does not contribute to the on axis beam current. The excess current creates the problems of outgassing and vacuum deterioration and power supply limitation. The above described problems are overcome by the emitter tip according to embodiments described herein.

In some embodiments, the emitter tip may include a first material (e.g. tungsten) and may have a coating or reservoir with a second material (such as ZrO, BaO, or PrO) for emitting electrons. According to some embodiments, the first material and/or the second material may be a crystalline material, in particular a monocrystalline or single crystal material. According to some embodiments, any material able to withstand the operation temperatures in a thermal field emitter with certain stability may be used as a material for the emitter tip. For instance, refractory metals may be used. In some examples, the emitter tip may include at least one material of the group consisting of: W, Cs/W, Ba/W, BaO/W, Th/W, Ce/W, La/W, Y/W, and Zr/W.

According to some embodiments, which may be combined with other embodiments, the thermal field emitter may have an operating temperature range of above 1000K, such as above 1300 K and even more typically above 1500K. In some embodiments, the thermal field emitter may have an operating temperature between about 1700K and about 2100K.

Figure 4:
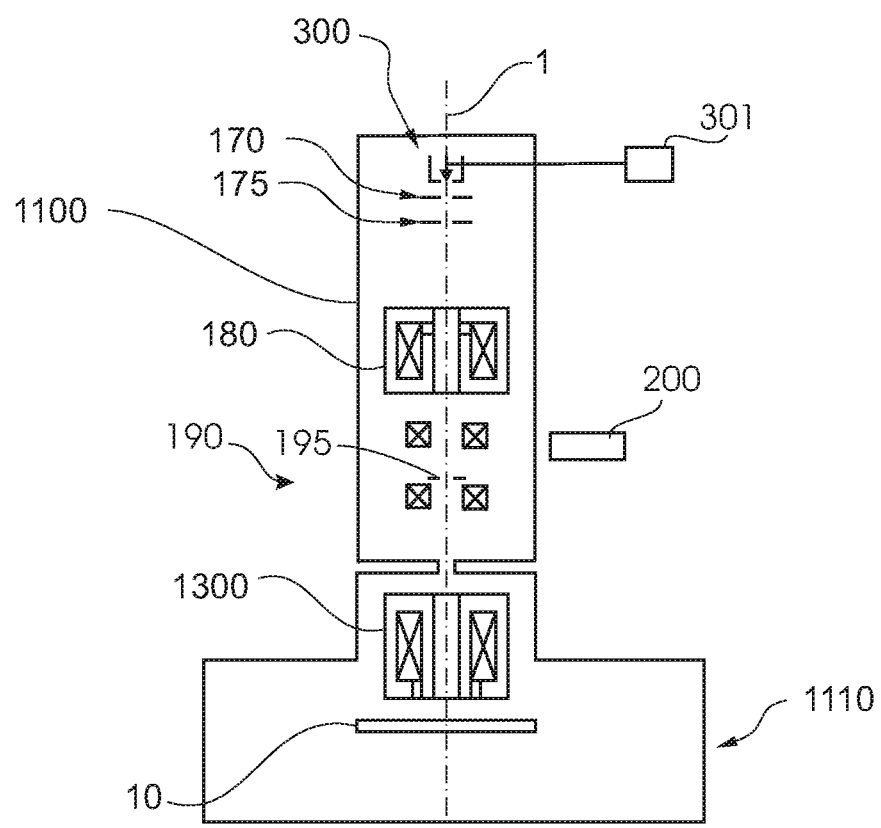
FIG. 4 shows a schematic view of an electron beam device according to embodiments described herein.

FIG. 4 shows a schematic view of an example of an electron beam device 1000 having an electron beam source 300 with a thermal field emitter and an emitter tip 100 according to embodiments described herein. The electron beam device 1000 according to embodiments described herein can for example be an electron microscope, such as a scanning electron microscope (SEM) or a scanning transmission electron microscope (STEM). In particular, an electron microscope can for example be an electron microscope for critical dimensioning (CD), defect review (DR), or inspection (EBI, that is electron beam inspection).

In an electron beam device, the performance of an electron beam source (e.g., a gun performance) may be considered with respect to a total performance of the electron beam device. For instance, a high vacuum (low pressure) can be provided for electron beam sources, e.g., in a range of $10^{-7}$ to $10^{-9}$ Pa, or even below $10^{-10}$ Pa around the electron beam source, e.g. within a housing 1100. Also a low partial pressure of at least some residual gases, which may poison the electron emitter, is beneficial. For example, oxygen can have a negative impact on the work function of an emitter material and on the electron emission. For achieving suitable vacuum conditions, a vacuum pumping device can be provided and can be selected from the group consisting of a turbo molecular pump, an ion getter pump, such as a non-evaporable getter pump, a cryopump, and any combination of the aforementioned devices.

According to some embodiments described herein, the electron beam device 1000 can include an electron beam source 300 located in a housing 1100, and a sample chamber 1110 connected to the housing 1100. In some implementation, a separate sample chamber vacuum generation device can be connected to the sample chamber 1110. In alternative embodiments, all elements may be arranged within one housing or chamber.

A sample 10 can be provided in the sample chamber 1110. The sample 10 can be provided on a sample support (not shown). The sample support can be a movable stage for positioning the sample 10. For example, the movable stage can be configured for moving the sample 10 in one direction (e.g. X direction), in two directions (e.g. X-Y-directions), or in three directions.

A sample as referred to herein, includes, but is not limited to, semiconductor wafers, semiconductor workpieces, masks, such as lithographic masks, multilayer masks and other workpieces such as memory disks and the like. Embodiments of the disclosure may be applied to any workpiece on which material is deposited or which are structured. A sample can include a surface to be structured or on which layers are deposited, e.g. an edge, a bevel, or the like.

The electron beam source 300 generates an electron beam, also denoted as the primary electron beam. According to some embodiments, which can be combined with other embodiments described herein, the electron beam source 300 includes a thermal field emitter having an emitter tip 100 according to embodiments described above, e.g. with respect to FIG. 1 to 3. In particular, the electron beam source 300 may have an emitter tip with an emission facet being arranged in a 100 crystallographic plane. In some embodiments, the emission facet of the emitter tip may be substantially perpendicular to the optical axis 1 of the electron beam device. According to some embodiments described herein, the electron beam source 300 may include a heating device 301 for heating the thermal field emitter. The heating device may be configured for heating in particular the emitter tip of the thermal field emitter. In some embodiments, the heating device 301 is configured for heating the thermal field emitter to the operating temperature, such as a temperature of up to 2100 K. In some embodiments, the heating device may be provided by a current heating device, a heating filament, or the like. For instance, the heating device may provide a heating current flowing through a heating filament. In some embodiments, the heating device is adjustable for adjusting the temperature of the emitter tip.

The (primary) electron beam is guided in the electron beam device 1000 along the optical axis 1 and is focused on the sample 10 by an objective lens 1300. The objective lens 1300 is exemplarily shown within the sample chamber 1110. According to some embodiments, the objective lens 1300 images, for example, the emitter tip 100 of the electron beam source on the sample 10. In some implementations, the objective lens 1300 can be provided by a magnetic lens portion and an electrostatic lens portion. According to some embodiments, which can be combined with other embodiments described herein, a deceleration of the primary electron beam can be provided, for example, in the vicinity of the sample 10, in or behind the objective lens 1300, or a combination thereof. For example, according to some embodiments, a retarding bias voltage can be applied to the sample 10. The objective lens 1300 can be an electrostatic-magnetic compound objective lens having e.g. an axial gap or a radial gap, or the objective lens 1300 can be an electrostatic retarding field lens.

According to embodiments described herein, a condenser lens 180 can be provided. The condenser lens 180 can be magnetic and have pole pieces and one or more coils. Alternatively, the condenser lens 180 can be electrostatic or combined magnetic-electrostatic. According to some embodiments, the condenser lens may be an immersion condenser lens.

In some embodiments, the electron beam source 300 may include at least one of an extractor device 170 and an anode 175. The extractor device 170 can be configured for providing a voltage difference to the emitter tip 100 for causing electron emission. The anode 175 can be configured to accelerate the primary electron beam. As an example, the anode 175 can be configured to accelerate the primary charged particle beam so that the primary charged particle beam has a predetermined energy when the primary charged particle beam passes along the optical axis 1 of the electron beam device. In some implementations, the energy of the primary electron beam leaving the extractor device 170 and/or the anode 175, can be in a range of 5 keV or above, specifically in a range of 10 keV to 50 keV, and more specifically about 15 or 40 keV. According to some embodiments, in transmission electron microscopes (TEM) and scanning transmission microscopes (STEM) the beam energy can even exceed 100 keV.

In some embodiments, a beam deflection device 190 is provided for deflecting and guiding the electron beam. According to some embodiments, a signal charged particle beam is released or backscattered from the sample when the primary hits or impinges the sample 10. The signal (or secondary) charged particle beam may be separated from the primary charged particle beam by means of the beam deflection device 190 according to some embodiments described herein. The beam deflection device 190 can include at least one of a beam splitter and a beam bender, one or more apertures, such as a spray aperture or knife edge aperture 195, or any combination thereof. The signal charged particle beam may be guided towards a detector assembly or a detector device 200, which can include a sensor, such as a scintillator, pin diode and the like.

One or more other optical components like alignment systems, correction systems, further detection systems and the like that are not shown in the present figures can be provided in embodiments of the electron beam device.

Elements described for the electron beam device like condenser lenses, apertures, deflectors and other optical components may be referred to as charged particle beam optics or electron beam optics for directing and focusing the electron beam device to the sample.

FIG. 5 shows a flow chart 700 of a method for operating an electron beam device according to embodiments described herein. In block 710, the method may include providing an electron beam source and an extractor device. For instance, the extractor device may be an electrode connected to a power supply. According to some embodiments, the electron beam source may be an electron beam source as described above e.g. with respect to FIG. 4 having an extractor, a heating device and a thermal field emitter. The electron beam source includes a thermal field emitter having an emitter tip. The emitter tip provides an emission facet configured for the electron emission, wherein the emission facet has an emission facet width. The provided emitter tip further includes a first side facet and a second side facet. An edge facet is formed between the first side facet and the second side facet, wherein the edge facet has an edge facet width. According to embodiments described herein, the edge facet width is between 20% and 40% of the emission facet width, and in particular between 25% and 35% of the emission facet width. According to some embodiments, the emitter tip as used for the operation of the electron beam device in block 710 may be an emitter tip as shown and described in the FIGS. 1 to 3.

The method for operating an electron beam device further includes in block 720 heating the thermal field emitter with a heating device. According to some embodiments, the heating may be performed up to the operating temperature of the thermal field emitter, e.g. up to a temperature above 1000K, such as typically a temperature between about 1500K and 2100K, more typically between about 1600K and about 2000K, and even more typically between about 1700K and about 1900K.

According to some embodiments, the heating may be performed by an adjustable heating device, such as a current heating device, a heating filament, or the like. For instance, the temperature of the emitter tip may be adjusted by adjusting a current flowing through the heating device. The temperature of the emitter tip may also be influenced by further parameters, like the thermal coupling of the thermal field emitter to the supporting structure, supply cables, and radiation exchange with the surroundings.

In block 730, an extraction voltage is applied between the thermal field emitter and the extractor device of the electron beam source. For instance, a voltage of a few kV may be applied to an electrode of the extraction device (such as an electrode of the extractor device 170 shown in FIG. 4). For instance, the voltage applied to the electrode of the extraction device may typically be between about 2 kV and about 30 kV, more typically between about 5 kV and 20 kV, such as about 10 kV. In some embodiments, an acceleration electrode may be provided after the extraction device along the optical axis, such as acceleration electrode provided by the anode 175 in FIG. 4. The acceleration electrode may be connected to a power supply and can be configured to bias the extractor device to a second potential. A voltage difference between the acceleration electrode provided by the anode 175 and the extractor device 170 can be larger than 100 kV. As an example, the voltage difference can be in a range of 0 to 40 kV, specifically in a range of 0 to 10 kV, and more specifically in a range of 5 to 30 kV. In some SEM applications the voltage difference can be in a range of 5 to 30 kV. In TEM the voltage can be larger than 100 kV.

According to some embodiments, the extraction field arising from the applied extraction voltage is influenced by several parameters, such as the tip shape, especially the radius of the tip and the shape of the facet; the geometry of the electrodes that provide the extraction field at the tip, in particular the extractor aperture (the distance from the emitter tip, the aperture diameter); the suppressor electrode, and the voltage applied to the extractor electrode.

In block 740, electrons are emitted from the emission facet of the emitter tip. According to some embodiments, the electrons are emitted from the emission facet having a 100 crystallographic orientation and/or the emission facet being arranged substantially perpendicular to the optical axis of the electron beam device, in which the emitter tip is to be used. In some embodiments, the emission facet may be the facet and the area of the emitter emitting a larger amount of electrons than the rest of the emitter tip.

In some embodiments, which may be combined with other embodiments described herein, the method for operating an electron beam device may further include deflecting, focusing and guiding the (primary) electron beam to a sample to be inspected. For instance, FIG. 4 shows an example of elements and devices, which may be used for directing and focusing the electron beam on a sample location, such as condenser lenses, objective lenses, deflector devices, apertures and the like. Also, the method for operating an electron beam device may include detecting secondary charged particles released or backscattered from the sample upon impingement of the primary electron beam. A detection device may be provided in the method for detection purposes.

FIG. 6 shows a flowchart 800 of a method for producing an emitter tip for a thermal field emitter for an electron beam source. In block 810, the method includes providing an emitter tip having an emitter tip surface. In particular the emitter tip may comprise a monocrystalline material. In one example, the emitter tip provided may have a first portion being in particular substantially round (e.g. by having substantially the shape of a sphere, an oval shape, the shape of an elongated sphere or the like) and a second portion (e.g. a shank of the emitter tip, as described with respect to FIG. 1).

According to some embodiments, in block 820, the emitter tip is processed by at least one of heating the emitter tip and applying an electrical field to the emitter tip. For instance, the emitter tip may be heated to a high temperature in the range of about 2000K, such as to a temperature typically between about 1500K to about 2100K, more typically between about 1600K and about 2000K, and even more typically between about 1700K and about 1900K. In some embodiments, the application of an electrical field may be performed with an electrical field in the range of several MV/mm. For instance, the electrical field may typically be between about 0.1 MV/mm and about 3 MV/mm, more typically between about 0.5 MV/mm and about 2 MV/mm and even more typically between about 1 MV/mm and about 1.5 MV/mm. According to some embodiments, the relation of the chosen value for the electrical field and the chosen value for the temperature can be considered. According to some embodiments, a suppressor voltage of typically between about 200V and about 500V, more typically between about 250V and about 400V, and even more typically between 250V and about 350V may be applied. In one example, the suppressor voltage may be about 300V.

The emitter tip is processed to give the specific shape of the emitter tip according to embodiments described herein, especially a shape of an emitter tip including an emission facet configured for the electron emission, wherein the emission facet has an emission facet width and a first side facet and a second side facet, wherein an edge facet is formed between the first side facet and the second side facet, wherein the edge facet has an edge facet width. In particular, the edge facet width is between 20% and 40%, especially between 25% and 35%, of the emission facet width. In particular, the shape of the emitter tip obtained by the method of flow chart 800 according to embodiments described herein may be the shape as described in detail with respect to FIGS. 1 to 3.

According to some embodiments, which may be combined with other embodiments described herein, the thermal field emitter may be provided by considering a equilibrium between the electric field applied to the emitter tip and the temperature applied to the emitter tip. For instance, if the temperature is relatively high and the electric field is relatively low, the emitter tip tends towards a spherical shape with a small or even vanishing round facet. In another example, if the temperature is relatively low and the electric field strength is relatively high, the emitter tip tends to be more like a truncated pyramid with a large square facet and sharp edges between the crystallographic planes.

According to some embodiments, the balance between temperature and electric field is chosen such that the resulting shape of the emitter tip is substantially the shape of the emitter tip described in embodiments above and, in particular, the long term emission is stable. For instance, either a lowered temperature (especially the lowering of the temperature by about 50K to about 150K, such as from 1850K to about 1750K) or the increase in the beam current setting (e.g. increasing the extraction voltage by a factor, such as a factor of between 1.0 and 1.5) may be used to form an emitter tip according to embodiments described herein.

In some embodiments, a method for producing an emitter tip according to embodiments described herein may include slowly ramp heating the emitter tip, e.g. heating the emitter tip to a temperature of about 1700K to about 2000K in 3 to 10 minutes. According to some embodiments, applying the electrical field may also be performed with a ramp function, i.e. increasing slowly the electrical field, such as up to a field strength of 80% of the operating field strength. The stabilization of the emitter tip may be observed for a few days and the extraction voltage may be adapted (e.g. on a daily basis) to obtain a threshold beam current. The method may also include some iteration of observing, adapting the emitter tip temperature, and adapting the extraction voltage.

According to embodiments described herein, the emitter tip and the electron beam device allow for being operated at a high stability, e.g. a stability of the emission current changing of typically less than 0.5 µA per day, and more typically less than 0.2 µA per day. The thermal field emitter and the electron beam device according to embodiments described herein yield more stable emission properties than known systems and can be operated over many months without noticeable change in extraction voltage, extraction current and beam current.

While the foregoing is directed to some embodiments, other and further embodiments may be devised without departing from the basic scope, and the scope is determined by the claims that follow.

The invention claimed is:

1. An electron beam device for inspecting a sample with an electron beam, the electron beam device including an optical axis, the electron beam device comprising:
   an electron beam source comprising a thermal field emitter for emitting an electron beam, the thermal field emitter comprising:
      an emitter tip comprising:
         an emission facet configured for electron emission, wherein the emission facet has an emission facet width; and
         a first side facet and a second side facet, wherein an edge facet is formed between the first side facet and the second side facet, the edge facet having an edge facet width; and
      wherein the edge facet width is between 20% and 40% of the emission facet width;
   the electron beam source further comprising:

an extractor device for applying an extraction voltage between the thermal field emitter and the extractor device; and a heating device for heating the thermal field emitter; the electron beam device further comprising:

electron beam optics for directing and focusing the electron beam onto the sample; and, a detector device for detecting secondary charged particles generated at an impingement or hitting of the electron beam on the sample.

2. The electron beam device according to claim 1, wherein the edge facet width is between 25% and 35% of the emission facet width.

3. The electron beam device according to claim 1, wherein the first side facet and the second side facet are arranged around the emission facet.

4. The electron beam device according to claim 1, wherein the emitter tip is a crystalline emitter tip and wherein the emission facet has a 100 orientation or wherein the emission facet is arranged perpendicular to the optical axis of the electron beam device.

5. The electron beam device according to claim 1, wherein the side facets are inclined with respect to the emission facet.

6. A thermal field emitter for emitting an electron beam in an electron beam device, the thermal field emitter comprising:

an emitter tip comprising:
an emission facet configured for electron emission, wherein the emission facet has an emission facet width; and
a first side facet and a second side facet, wherein an edge facet is formed between the first side facet and the second side facet, the edge facet having an edge facet width; and
wherein the edge facet width is between 20% and 40% of the emission facet width.

7. The thermal field emitter according to claim 6, wherein the edge facet width is between 25% and 35% of the emission facet width.

8. The thermal field emitter according to claim 6, wherein the first side facet and the second side facet are arranged around the emission facet.

9. The thermal field emitter according to claim 6, wherein the side facets are inclined with respect to the emission facet.

10. The thermal field emitter according to claim 6, wherein the emitter tip is a single crystal emitter tip.

11. The thermal field emitter according to claim 6, wherein the emission facet has a 100 crystallographic orientation.

12. The thermal field emitter according to claim 6, wherein the emission facet has an octagonal shape.

13. The thermal field emitter according to claim 6, wherein the emission facet width is between 200 nm and 500 nm.

14. The thermal field emitter according to claim 6, wherein the emitter tip is an emitter tip comprising tungsten and is coated with ZrO.

15. The thermal field emitter according to claim 6, wherein the first side facet and the second side facet have a 110 crystallographic orientation.

16. The thermal field emitter according to claim 6, wherein the edge facet has a 211 crystallographic orientation.

17. Method for producing an emitter tip for a thermal field emitter for a source of an electron beam, comprising providing an emitter tip comprising an emitter tip surface; and processing the emitter tip by heating the emitter tip and applying an electrical field to the emitter tip;

wherein an emission facet configured for electron emission having an emission facet width, a first side facet, a second side facet, and an edge facet between the first side facet and the second side facet having an edge facet width are formed, wherein the edge facet width is formed to be between 20% and 40% of the emission facet width.

18. The method for producing an emitter tip according to claim 17, wherein the first side facet and the second side facet are formed around the emission facet.

19. A method for operating an electron beam device, comprising:

providing an electron beam source comprising a thermal field emitter and an extractor device, wherein the thermal field emitter comprises an emitter tip comprising an emission facet configured for electron emission, wherein the emission facet has an emission facet width; and a first side facet and a second side facet, wherein an edge facet is formed between the first side facet and the second side facet, the edge facet having an edge facet width; and wherein the edge facet width is between 20% and 40% of the emission facet width heating the thermal field emitter with a heating device;

applying an extraction voltage between the thermal field emitter and the extractor device of the electron beam source; and emitting electrons from the emission facet.

20. The method for operating an electron beam device according to claim 19, further comprising directing the electrons emitted by the emitter tip to a sample by electron beam optics.

* * * * *